United States Patent
Jackson et al.

(10) Patent No.: US 6,720,572 B1
(45) Date of Patent: Apr. 13, 2004

(54) ORGANIC LIGHT EMITTERS WITH IMPROVED CARRIER INJECTION

(75) Inventors: Thomas N. Jackson, State College, PA (US); Hagen Klauk, Erlangen (DE)

(73) Assignee: The Penn State Research Foundation, University Park, PA (US)

( * ) Notice: Subject to any disclaimer, the term of this patent is extended or adjusted under 35 U.S.C. 154(b) by 0 days.

(21) Appl. No.: 09/602,438

(22) Filed: Jun. 23, 2000

Related U.S. Application Data (60) Provisional application No. 60/141,161, filed on Jun. 25, 1999.

(51) Int. Cl.[7] ............... H01L 35/24; H01L 29/04; H01L 33/00
(52) U.S. Cl. ............... 257/40; 257/103; 257/24; 257/72; 257/59
(58) Field of Search ............... 257/24, 40, 103, 257/72, 59

(56) References Cited

U.S. PATENT DOCUMENTS

| | | | |
|---|---|---|---|
| 5,142,343 A | 8/1992 | Hosokawa et al. | 357/17 |
| 5,457,565 A * | 10/1995 | Namiki et al. | 359/273 |
| 5,640,067 A * | 6/1997 | Yamauchi et al. | 313/504 |
| 5,677,572 A | 10/1997 | Hung et al. | 257/750 |
| 5,681,756 A | 10/1997 | Norman et al. | 437/1 |
| 5,739,545 A * | 4/1998 | Guha et al. | 257/40 |
| 5,970,318 A | 10/1999 | Choi et al. | 438/99 |
| 6,150,668 A * | 11/2000 | Bao et al. | 257/40 |
| 6,303,239 B1 * | 10/2001 | Arai et al. | 428/690 |

OTHER PUBLICATIONS

PCT Search Report dated Dec. 20, 2000 for PCT/US00/17325.

* cited by examiner

Primary Examiner—George Eckert
Assistant Examiner—Joseph Nguyen
(74) Attorney, Agent, or Firm—Ohlandt, Greeley Ruggiero & Perle (57) ABSTRACT

A light emitting device with improved carrier injection. The device has a layer of organic light emitting material and a layer of organic semiconductor material that are interposed between first and second contact layers. A carrier transport layer, may optionally be included between the semiconductor and light emitting layers. When used as a diode, the first and second contacts are functionally the anode and cathode. The device can also be a field effect transistor device by adding a gate contact and a gate dielectric. The first and second contacts then additionally have the function of source and drain, depending on whether the organic semiconductor material is a p-type or an n-type. Preferably, the organic semiconductor is formed with pentacene.

29 Claims, 4 Drawing Sheets

ORGANIC LIGHT EMITTERS WITH IMPROVED CARRIER INJECTION

This Application claims the benefit of U.S. Provisional Application No. 60/141,161, filed Jun. 25, 1999.

FIELD OF THE INVENTION

This invention relates to light emitting devices and, in particular, to organic light emitting devices.

BACKGROUND OF THE INVENTION

Organic light emitting diodes are of interest for emissive flat panel displays with low, medium, or high information content for a wide range of military, industrial, consumer, and automotive applications. For virtually all applications, but particularly for portable and other low-power applications, devices with low turn-on voltage and low operating voltages are desirable.

Organic light emitting diodes are typically fabricated by sandwiching one or more appropriate organic films between two conductive electrodes. When an electric field is applied across the device, electrons are injected into the organic film from the negatively charged electrode (the cathode), and holes are injected from the positively charged electrode (the anode). The injected carriers travel through the organic material under the influence of the electric field. When a pair of oppositely charged carriers meet, they recombine and emit light. The amount of light generated in the electroluminescent material is approximately proportional to the electric current flowing through the device, which can be increased by applying a larger electric field.

The voltage at which organic electroluminescent diodes turn on and begin to emit light is often determined by the electric field required to inject an appreciable number of charge carriers. Since most organic materials considered for electroluminescent diodes have very small intrinsic carrier densities, carrier injection from external contacts is essential, but also is often problematic due to the large electrical resistivity of the organic materials.

Similarly, the electric current flowing through the device at a particular voltage depends critically on the number of charge carriers injected from the contacts at that particular voltage. Thus, the voltage required to drive a particular electric current through the device and obtain a particular brightness can be reduced by providing improved carrier injection at the contacts. Lower operating voltages are desirable, since they allow the organic electroluminescent diode or display device to operate with lower power consumption, with a smaller power supply or longer battery lifetime, and with reduced heat dissipation.

Contacts to organic light emitting diodes are typically fabricated using inorganic materials. A low-work function metal, such as calcium, magnesium, or aluminum, is typically used for the electron-injection (cathode) contact, and a conductive transparent metal oxide, such as indium tin oxide, is often used as the hole-injecting (anode) contact. At least one of the contacts is usually transparent or semi-transparent so that the light generated in the electroluminescent material can exit the device efficiently. Indium tin oxide provides not only large optical transmittance, but also a relatively large work function which is beneficial to obtaining good hole injection from the anode contact. A low work function, such as provided by calcium, magnesium, or aluminum contacts, is beneficial to obtaining efficient electron injection from the cathode.

Many of the problems and limitations of organic light emitting devices are due to the fact that the typically used inorganic contacts usually must inject carriers into organic materials with very small intrinsic carrier densities. The problems associated with the inorganic/organic contact interfaces can be reduced by sandwiching a thin layer of a highly conductive organic contact material between the organic light emitter and the inorganic contact. This has resulted in a significant improvement in the carrier injection efficiency.

Organic contact materials that have previously been considered include polyaniline and the phthalocyanines, such as copper phthalocyanines (CuPc) and 3,4,9,10-perylenetetracarboxylic dianhydride (PTCDA). Also, ultrathin self-assembled polymer layers have improved carrier injection properties in organic light emitters.

The improvement in carrier injection is typically credited to an improved energy band lineup at the contact interface. More specifically, the introduction of a suitable interfacial layer is believed to reduce the height of the energy barrier which the charge carriers have to surmount upon injection from the contact into the organic light emitter, resulting in lower turn-on voltage and larger current densities. That is, the organic layer is used to modify the effective work function of the inorganic contact material, either by using an organic conductor as a functional replacement for an inorganic conductor (but with a modified work function) or by using an organic interfacial layer to develop a potential drop which modifies the work function.

SUMMARY OF THE INVENTION

The present invention provides a light emitting device having an organic light emitting layer and an organic semiconductor layer that enhances carrier density or injection. These layers are interposed between first and second contact layers. A carrier transport layer can be optionally interposed between the light emitting and semiconductor layers. When used as a diode, the first and second contacts function as an anode and a cathode.

According to other embodiments of the present invention, the light emitting device is further provided with a gate contact and a gate dielectric. These embodiments function as a field effect device with the first and second contacts also functioning as a source and a drain, depending on whether the semiconductor layer is a p-type or n-type material.

The devices of the present invention have the important advantages of a much wider range of available material band gaps and work functions. The field effect device embodiments have the ability of controlling the carrier density in the organic semiconductor to control injection into the light emitter.

BRIEF DESCRIPTION OF DRAWING

Other and further objects, advantages and features of the present invention will be understood by reference to the following specification in conjunction with the accompanying drawings, in which like reference characters denote like elements of structure and.

DESCRIPTION OF THE PREFERRED EMBODIMENT

Figure 1:
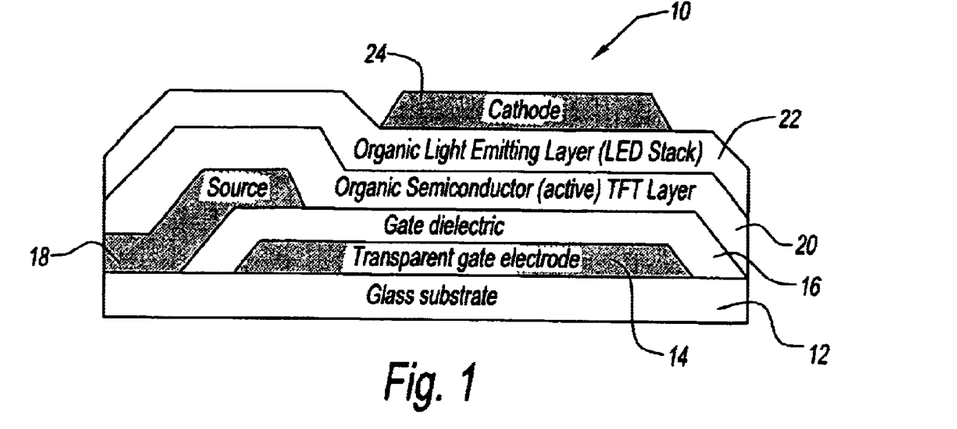
FIG. 1 is a view in cross section of a light emitting device of the present invention.

Referring to FIG. 1, an organic light emitting device 10 includes a glass substrate 12, upon which is disposed a gate electrode 14, a gate dielectric 16, and an electrically conductive contact 18. An organic active thin film (TFT) layer 20 overlies gate dielectric 16 and contact 18. An organic light emitting layer 22 overlies TFT layer 20. Another electrically conductive contact 24 overlies organic LED layer 22. Gate electrode 14 is transparent to light emitted by organic LED layer 22.

Electrical contacts 18 and 24 are labeled as source and cathode, respectively. This notation assumes that TFT layer 20 is a p-channel type. Contact 18 functions as a source and as an anode to inject positive charge carriers into TFT layer 20 and contact 24 functions as a drain and a cathode to inject electrons into LED layer 22. If instead TFT layer 20 were an n-channel type, the functions of contacts 18 and 24 would be interchanged. That is, contact 18 would then inject electrons into TFT layer 20 and its function would be a drain and a cathode. Contact 24 would insert holes into LED layer 22 and its function would be a source and an anode. In either case, gate electrode 14 controls the electric field provided between contacts 18 and 24, thereby controlling the injection of carriers into organic LED stack 22.

Figure 2:
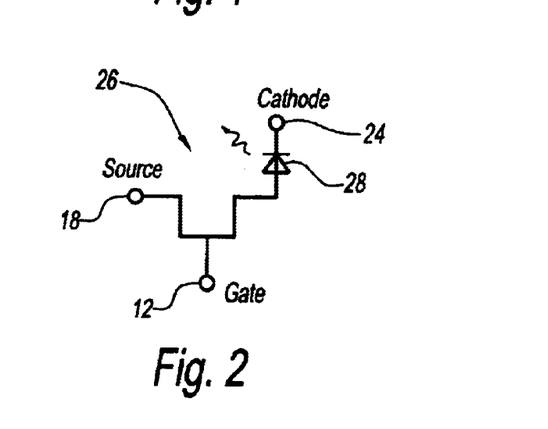
FIG. 2 is an equivalent electrical circuit for the light emitting device of FIG. 1.

Referring to FIG. 2, light emitting device 10 is shown in an equivalent electrical circuit as a field effect transistor 26 and a light emitting diode (LED) 28. LED 28 is essentially a part of the source drain channel of FET 26. A voltage applied between contacts 18 and 24 sets up an electric field in organic TFT layer 20 and organic LED layer 22. A voltage applied to gate electrode 14 controls this electric field. That is, the voltage on gate electrode 14 controls the brightness of light emitted by LED layer 22. Light emitting device 10 is useful as a pixel in a display.

Figure 3:
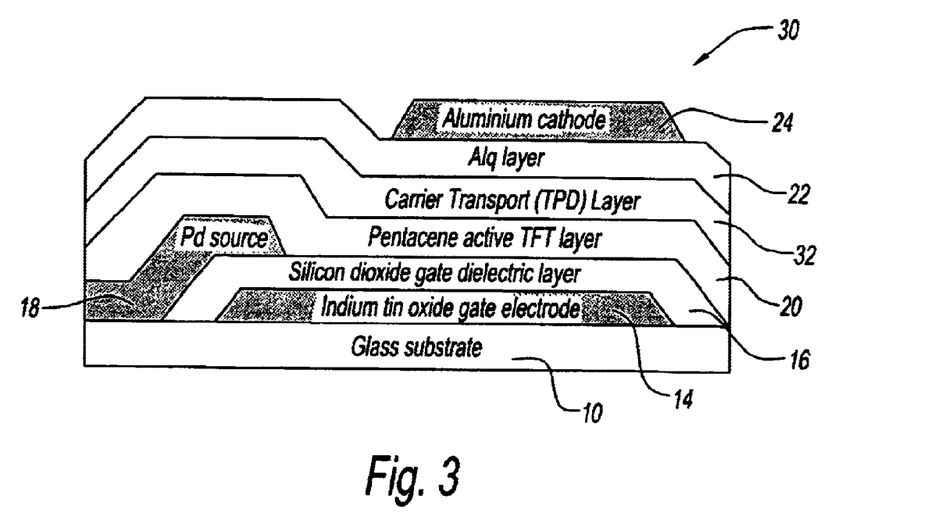
FIG. 3 is an alternate embodiment of a light emitting device of the present invention.

Referring to FIG. 3, an alternate embodiment is depicted as a light emitting device 30. Light emitting device 30 differs from light emitting device 10 in two aspects. First, interposed between light emitting layer 22 and TFT layer 20 is a carrier transport layer 32 of organic material that is preferably tetraphenyldiamine (TPD). Carrier transport layer 32 enhances carrier (or hole for the source notation of FIG. 3) injection. Second, preferred materials for gate electrode 14, gate dielectric 16, source contact 18, TFT layer 20, light emitting layer 22 and cathode contact 24 are identified as indium tin oxide, (ITO) silicon dioxide, palladium (PD), pentacene, 8-hydroxyquinoline aluminum (Alq) and aluminum, respectively.

Figure 4:
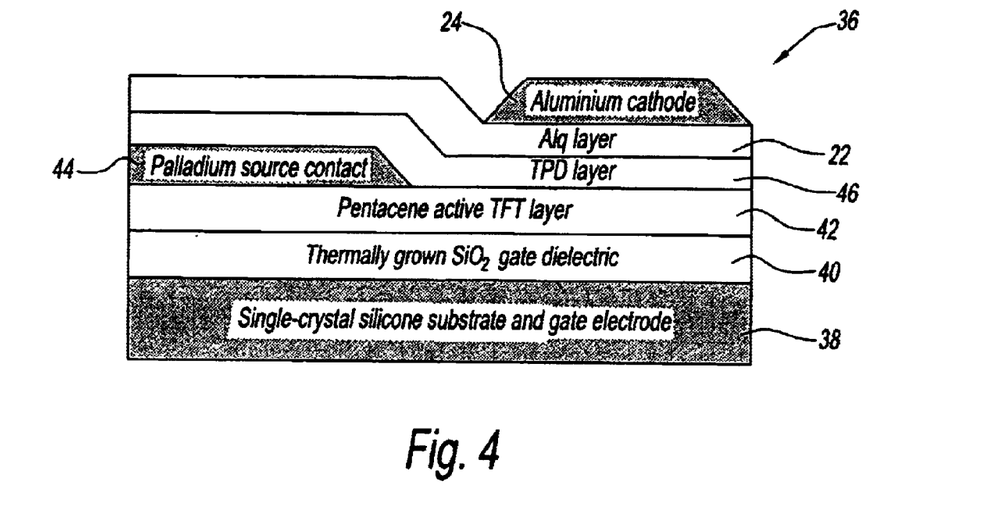
FIG. 4 is an alternate embodiment of a light emitting device of the present invention.

Referring to FIG. 4, another alternate embodiment is depicted as light emitting device 36. Light emitting device 36 includes a substrate 38 that serves as a combination substrate and gate electrode. A gate dielectric layer 40 is disposed on substrate 38. A TFT layer 42 is disposed on gate dielectric layer 40 and a source contact 44 is disposed on TFT layer 42. A carrier transport layer 46 is disposed on TFT layer 42 and source contact 44. Light emitting layer 22 is disposed on carrier transport layer 46 and cathode contact 24 is disposed on light emitting layer 22.

Substrate 38 is a semiconductor, such as single crystal silicon that serves as a combination substrate and gate electrode. Preferred materials for gate dielectric 40, source contact 44, TFT layer 42, carrier transport layer 46, light emitting layer 22 and cathode contact 24 are identified as ITO, silicon dioxide, PD, pentacene, TPD, Alq and aluminum, respectively.

Figure 5:
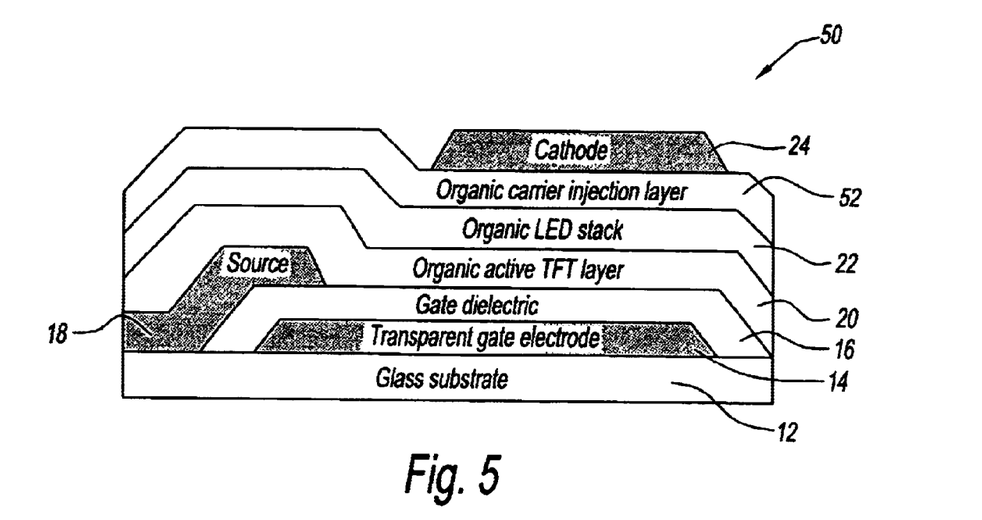
FIG. 5 is an alternate embodiment of a light emitting device of the present invention.

Referring to FIG. 5, another alternate embodiment depicts a light emitting device 50. Light emitting device 50 differs from light emitting device 10 of FIG. 1 by the insertion of an organic carrier injection layer 52 between light emitting layer 22 and cathode contact 24. This improves the carrier injection at the interface of inorganic contact 24 and light emitting layer 22.

Substrate 12 may be any suitable glass substrate, such as Corning™ Model 7059. Transparent gate electrode 14 is formed of either indium tin oxide (ITO) or ion-beam sputtered ultra-thin metal films. Metal films deposited by ion-beam sputtering have exceptionally small surface roughness (near 1 Å rms, near 10 Å peak-to-valley roughness), and films as thin as about 20 Å are continuous and conductive and provide optical transmittance as large as 80%. Ultra-thin metal films are deposited at room temperature and require no post-deposition anneal, thereby significantly simplifying the fabrication process.

Gate dielectric layer 16 can be prepared, for example, either by plasma-enhanced chemical vapor deposition (PECVD) of silicon nitride at a substrate temperature of 250° C. or by reactive ion-beam sputtering of silicon dioxide at a substrate temperature of 80° C. Source contact 18 is preferably formed of Palladium, since it provides a large work function, is not significantly oxidized, and, when prepared by ion-beam sputtering, has exceptionally small surface roughness which leads to improved carrier injection into TFT layer 20.

The three organic materials, pentacene, TPD, and Alq, are small-molecule organic compounds. It will be apparent to those skilled in the art that other small-molecule organic compounds or polymers may be used. The three organic materials, pentacene, TPD, and Alq, can be deposited by thermal evaporation in vacuum. During the pentacene deposition, the substrate is held at about 60° C. to improve the carrier mobility in TFT channel layer 20. The TPD and Alq layers 32 and 22 are deposited with substrate 12 held at about room temperature to reduce undesired film crystallization. Film thickness is typically about 500 Å for pentacene layer 20, about 300 Å for TPD layer 32, and about 350 Å for Alq layer 22. When fabricating an array of pixels, the aluminum cathodes are deposited through a mechanically aligned shadow mask.

In the embodiments of FIGS. 1–5, it is contemplated that gate electrode 12, source contact layer 18 and cathode layer 24 may be any suitable organic or inorganic material that is electrically conductive. For example, gate electrode 12 may be any suitable electrically conductive material, such as ITO, or any suitable metal (transparent for bottom emitting devices); source contact layer 18 may be any suitable organic or inorganic material that is electrically conductive and forms a useful contact with the organic semiconductor layer 20, such as PD; and cathode contact layer 24 may be any suitable organic or inorganic material that is electrically conductive and forms a useful contact with the organic light emitting layer 22, such as aluminum. It is also contemplated that semiconductor layer 20 may be any suitable organic semiconductor material, such as polymers or small molecule materials, such as, pentacene; that light emitting layer 22 may be any suitable electroluminescent organic polymer or small molecule material, such as Alq, or PPV; that carrier transport layer 32 may be any suitable organic polymer or small molecule material, such as TPD, or NPB; and that gate dielectric may be any suitable organic or inorganic material with an appropriate dielectric characteristic, such as silicon nitride, silicon dioxide or, for example, polymers that exhibit an appropriate dielectric characteristic.

Both patterned and unpatterned pixels can be fabricated. In the patterned devices, gate electrodes, gate dielectric layer, and source contacts can be patterned by photolithography and lift-off; cathode contacts can be deposited through a shadow mask that is aligned with respect to the source contacts using an optical microscope. In the unpatterned pixels, only the source contacts and the cathode contacts are patterned. All other layers are unpatterned. In addition to bottom-emitting pixels, top-emitting pixels can also be fabricated, using a low-resistivity silicon wafer as the substrate and gate electrode, thermally grown silicon dioxide as the gate dielectric layer, and semitransparent cathode contacts prepared from 100 Å thick aluminum films.

Figure 11:
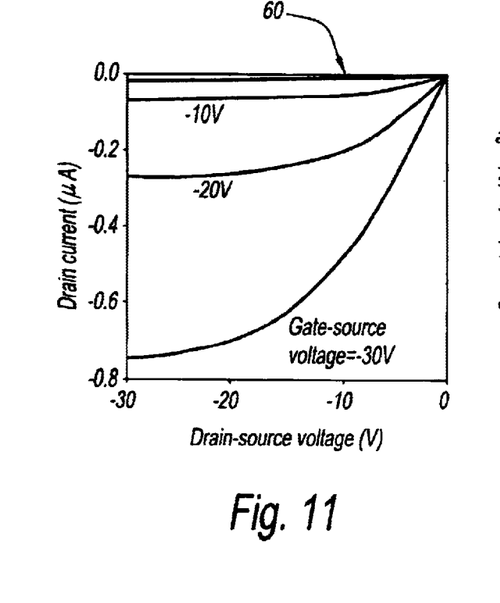
FIG. 11 is a graph depicting the drain current-drain voltage characteristic for the light emitting device of FIG. 1.
Figure 12:
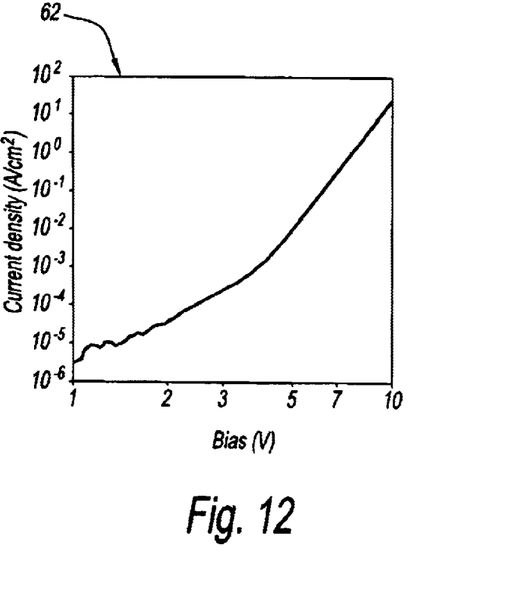
FIG. 12 is a graph depicting the current density and bias voltage for the light emitting device of FIG. 1.

Referring to FIG. 11, a graph 60 shows the electrical characteristics of light emitting device:10 with a pentacene TFT layer 20 and a silicon nitride gate dielectric 16. This device has near-zero threshold voltage and carrier field-effect mobility near 0.6 cm$^2$/V-s. Light emitting devices with an ion-beam sputtered silicon dioxide gate dielectric 16 have very similar electrical characteristics. Referring to FIG. 12, a graph 62 shows the current-voltage characteristics of a non-integrated light emitting device fabricated on the same substrate as the integrated devices, but with a pentacene layer between the source or anode contact and the TPD layer. Because pentacene provides a large carrier concentration and improved hole injection, the light emitting device has a low turn-on voltage of about 4 V and provides high brightness at relatively low bias.

Figure 6:
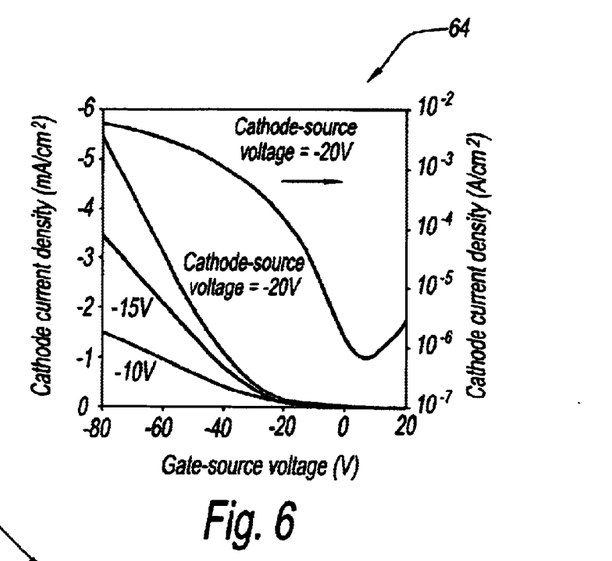
FIG. 6 is a graph depicting electrical characteristics of the light emitting devices of the present invention.

Referring to FIG. 6, a graph 64 shows the electrical characteristics of an unpatterned integrated pixel with silicon nitride as gate dielectric 16. The device operates in a common-source configuration, and the current density is controlled by adjusting the gate-source bias, thereby allowing the pixel brightness to be modulated over four orders of magnitude. The effect of adjusting the gate-source bias is to modulate the carrier sheet density in the TFT channel layer 20 and, thus, the injection of holes into the light emitting layer 22, while the voltage across source 18 and cathode 24 provides an electric field across the diode and electron injection into emissive layer 22. Light emission occurs when the cathode current exceeds about 1 mA/cm$^2$. Integrated pixels fabricated with an ion-beam deposited silicon dioxide gate dielectric 16 have very similar electrical characteristics. In general, the electrical characteristics of patterned and unpatterned integrated pixels are very similar Thus, organic semiconductor devices 10, 30, 36 and 50 include an organic semiconductor field effect transistor integrated with an organic light emitter. The field effect transistor controls the carrier density for a single contact 18 of the organic light emitter for organic light emitting devices 10, 30 and 36 and for both contacts 18 and 24 of organic light emitting device 50. This provides an advantage that the inorganic contact (often a metal) can be physically separated from the organic emitter, thereby allowing improvements in device reliability.

According to the present invention, three-electrode light emitting devices employ a small-molecule organic semiconductor, such as pentacene, as a carrier-injection material. Alternative embodiments of the present invention employ a layer;of small-molecule organic semiconductor material, such as pentacene, in a two-electrode light emitting device or light emitting diode (LED). LEDs using a pentacene contact layer provide dramatic improvements in turn-on voltage and brightness compared with similar devices prepared without a pentacene contact layer.

Figure 7:
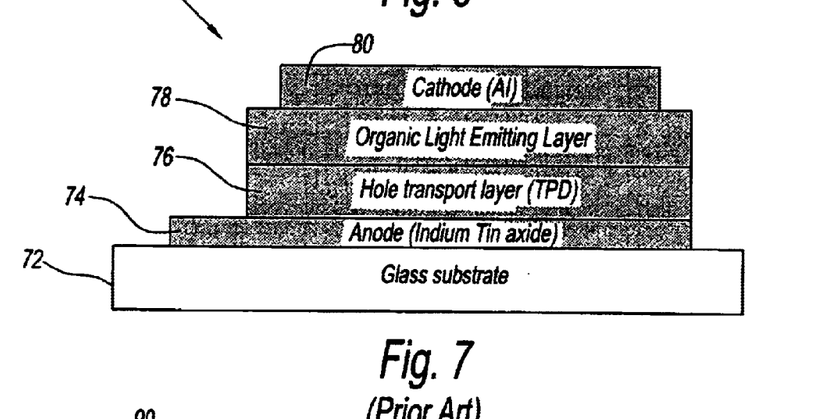
FIG. 7 is a view in cross section of a prior art light emitting diode.

Referring to FIG. 7, a prior art LED 70 includes a substrate 72 that, for example is glass. Disposed on substrate 72 is an anode layer 74 formed of ITO. Disposed on anode layer 74 is a hole transport layer 76 formed of TPD.

Disposed on hole transport layer 76 is a light emitting layer 78 formed of the electroluminescent material Alq. Alq also has a good electron transport capability. Disposed on light emitting layer 78 is a cathode layer 80 formed of an inorganic electrically conductive material, such as aluminum.

Figure 8:
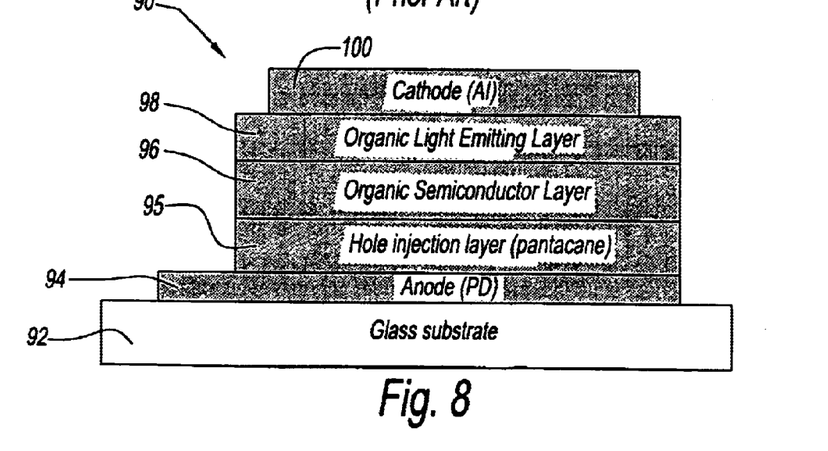
FIG. 8 is view in cross section of a light emitting diode of the present invention.

Referring to FIG. 8, an alternate embodiment of the present invention is an LED 90 that has a substrate 92 that, for example, is glass. Disposed on substrate 92 is an anode layer 94 formed of palladium. Disposed on anode layer 94 is a hole injection layer 95 formed of pentacene, Disposed on hole injection layer 95 is a hole transport layer 96 formed of TPD. Disposed on hole transport layer 96 is a light emitting layer 98 formed of the electroluminescent material Alq. Disposed on light emitting layer 98 is a cathode layer 100 formed of an inorganic electrically conductive material, such as aluminum.

Figure 9:
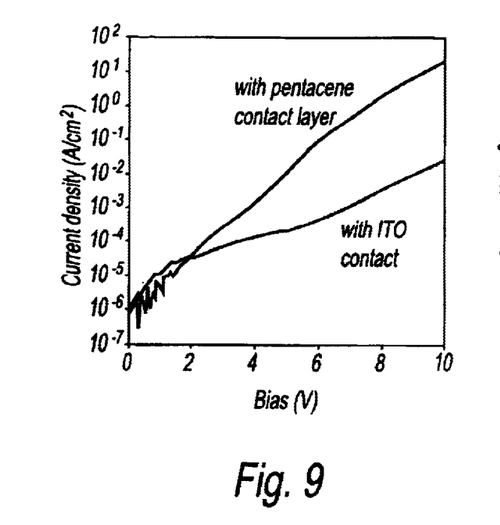
FIGS. 9 and 10 are graphs depicting electrical characteristics of the light emitting diodes of FIGS. 7 and 8.
Figure 10:
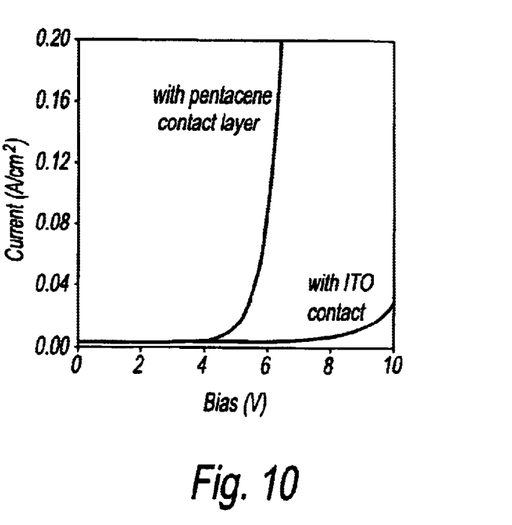

Referring to FIGS. 9 and 10, the current density-voltage characteristics are depicted for LEDs 70 and 90. For both LEDs, light emission occurs when current density exceeds about $10^{-4}$ A/cm$^2$. The turn-on voltage (applied across the anode and cathode layers) was reduced from about 5 volts for LED 70 without a pentacene contact layer to about 3 volts for LED 90 fabricated with a pentacene contact layer. For operating voltages larger than about 6 volts, the pentacene contact layer provides an improvement in current density of two orders of magnitude. For operating voltages larger than about 10 volts, the improvement in current density is more than three orders of magnitude.

The significant improvement in carrier injection observed in the LEDs of the present invention can be explained by the large charge carrier density obtained in thin pentacene films and the pentacene work function. Although bulk pentacene is an excellent insulator with a resistivity near $10^{14}$ ohm-cm, thin pentacene films deposited by thermal evaporation often form a carrier channel near the substrate interface. From current-voltage measurements performed on pentacene thin film transistors, carrier sheet densities between $10^{12}$ and $10^{13}$ cm$^{-2}$ are obtained, even in the absence of gate-field-induced carrier accumulation. For a pentacene film with an average thickness of 500 Å, this indicates an average carrier volume density on the order of $10^{18}$ cm$^{-3}$. Since most of the charge in the pentacene layer is concentrated in a very thin layer near the substrate interface, the maximum carrier volume density attainable in thin pentacene films is likely to be on the order of $10^{19}$ cm$^{-3}$ or larger. Large carrier densities such as those observed in thin, vacuum-deposited pentacene films can lead to enhanced carrier injection into organic light emitting diode materials.

Other approaches to providing a large carrier density in the organic semiconductor are also possible, for example providing photogenerated carriers (which may be useful for optical logic). The central theme that connects these approaches is the use of an organic semiconductor, possibly with chosen work function (that is, chosen HOMO (highest occupied molecular orbital) and LUMO (lowest unoccupied molecular orbital) positions) to provide an interface to an organic emitter, and a mechanism, with or without control, to provide a large carrier density in the organic semiconductor for improved injection into the organic emitter.

The present invention having been thus described with particular reference to the preferred forms thereof, it will be obvious that various changes and modifications may be made therein without departing from the spirit and scope of the present invention as defined in the appended claims.

What is claimed is:

1. A semiconductor device comprising:
   a thin film transistor and a light emitting diode that share a common layer of semiconductor material and a first electrical contact;
   a second electrical contact disposed with respect to said common layer of semiconductor material such that carriers injected via one of said first and second electrical contacts into said common layer of semiconductor material are received by the other of said first and second electrical contacts without intervening removal thereof by any other electrical contact to said common layer of semiconductor material, wherein said first and second electrical contacts are one of (i) a cathode of said light emitting diode and a source of said thin film transistor, respectively, and (ii) an anode of said light emitting diode and a drain of said thin film transistor, respectively;
   a layer of light emitting material disposed between said first electrical contact and said common layer of semiconductor material; and
   a gate electrical contact disposed with respect to said common layer of semiconductor material so as to control said carriers in response to an applied signal.

2. The light emitting device of claim 1, wherein one of said first and second electrical contacts is at least partially transparent to light.

3. The light emitting device of claim 1, wherein said light emitting layer includes a first organic material and said common layer of semiconductor material includes a second organic material, and wherein said second organic material is selected from the group that consists of polymers and small molecule materials.

4. The light emitting device of claim 3, wherein said first electrical contact is an anode and said second electrical contact is a cathode.

5. The light emitting device of claim 4, further comprising a carrier transport layer that includes a third organic material and that is interposed between said anode and said common layer of semiconductor material.

6. The light emitting device of claim 5, wherein said first, second and third organic materials are selected from the group that consists of polymers and small molecule materials.

7. The light emitting device of claim 6, wherein one of said anode and said cathode includes a material that is at least partially transparent to light.

8. The light emitting device of claim 7, wherein said one of said anode and cathode is said anode, and wherein said material that is at least partially transparent to light is indium tin oxide.

9. The light emitting device of claim 8, wherein said cathode is metallic.

10. The light emitting device of claim 1, further comprising a layer of dielectric material that is disposed between said gate electrical contact and said first and second electrical contact.

11. The light emitting device of claim 10, wherein said common layer of semiconductor material forms a channel of a field effect transistor between said first and second electrical contacts.

12. The light emitting device of claim 11, wherein said light emitting layer is located within an electric field produced when a voltage is applied across said first and second electrical contacts.

13. The light emitting device of claim 10, further comprising a carrier transport layer that includes organic material and that is interposed between said first and second electrical contacts.

14. The light emitting device of claim 13, wherein said carrier transport layer is interposed between said common layer of semiconductor material and said light emitting layer.

15. The light emitting device of claim 14, wherein said carrier transport material is selected from the group that consists of polymers and small molecule materials.

16. The light emitting device of claim 15, wherein said dielectric layer is either silicon nitride or silicon dioxide.

17. The light emitting device of claim 13, further comprising a carrier injection layer, and wherein said light emitting layer is interposed between said common layer of semiconductor material and said carrier injection layer.

18. The light emitting device of claim 1, wherein said carriers are holes.

19. The light emitting device of claim 18, wherein said carriers are electrons.

20. A semiconductor device comprising:
    a thin film transistor and a light emitting diode that share a common layer of semiconductor material;
    a first electrical contact and a second electrical contact disposed with respect to said common layer of semiconductor material, wherein, when a voltage is applied to said first and second electrical contacts, carriers are injected into said common layer of semiconductor material via said first electrical contact and received by said second electrical contact without any intervening draining of said carriers from said common layer of semiconductor material via any other electrical contact, wherein said first electrical contact is a source of said thin film transistor;
    a layer of light emitting material disposed between said second electrical contact and said common layer of semiconductor material; and
    a gate electrical contact disposed with respect to said common layer of semiconductor material so as to control said carriers in response to an applied signal.

21. The semiconductor device of claim 20, wherein said first electrical contact is in direct contact with said common layer of semiconductor material, thereby enhancing injection of said carriers and contact with said semiconductor material.

22. The semiconductor device of claim 20, wherein said semiconductor material and said light emitting material are organic.

23. The semiconductor device of claim 20, wherein said organic light emitting material and said semiconductor material are selected from the group consisting of: polymers and small molecule materials.

24. The semiconductor device of claim 23, wherein said semiconductor material is pentacene.

25. The semiconductor device of claim 20, wherein a layer of carrier transport material is disposed between said layer of light emitting material and one of said first and second electrical contacts.

26. The semiconductor device of claim 25, wherein said light emitting material, said semiconductor material and said carrier transport material are organic and are selected from the group consisting of: polymers and small molecule materials.

27. The semiconductor device of claim 20, wherein at least one of said first and second electrical contacts and said gate electrical contact is at least partially transparent to light.

28. The semiconductor device of claim 20, wherein said common layer of semiconductor material has a carrier sheet density in the range of about $10^{12}$ to about $10^{13}$ cm$^2$.

29. The semiconductor device of claim 20, wherein said common layer of semiconductor material has a carrier sheet density that is adjustable in the range of about $10^{12}$ to about $10^{13}$ cm$^2$ by means of said signal applied to said gate electrical contact.

* * * * *

UNITED STATES PATENT AND TRADEMARK OFFICE
CERTIFICATE OF CORRECTION

PATENT NO. : 6,720,572 B1
DATED : April 13, 2004
INVENTOR(S) : Jackson et al.

It is certified that error appears in the above-identified patent and that said Letters Patent is hereby corrected as shown below:

Column 1,
Line 7, insert the following:
-- STATEMENT OF GOVERNMENT RIGHTS

This invention was made with support from the Government under Grant No. F33615-98-1-5164. The Government has certain rights in the invention. --.

Signed and Sealed this

Twenty-third Day of May, 2006

JON W. DUDAS
*Director of the United States Patent and Trademark Office*